(12) United States Patent
Ikegaya et al.

(10) Patent No.: US 12,549,082 B2
(45) Date of Patent: Feb. 10, 2026

(54) POWER CONVERSION DEVICE AND METHOD OF CONTROLLING POWER CONVERSION DEVICE

(71) Applicant: Hitachi Astemo, Ltd., Hitachinaka (JP)

(72) Inventors: Katsumi Ikegaya, Hitachinaka (JP); Yoichiro Kobayashi, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 273 days.

(21) Appl. No.: 18/252,562

(22) PCT Filed: Sep. 10, 2021

(86) PCT No.: PCT/JP2021/033349
§ 371 (c)(1),
(2) Date: May 11, 2023

(87) PCT Pub. No.: WO2022/102233
PCT Pub. Date: May 19, 2022

(65) Prior Publication Data
US 2024/0006975 A1 Jan. 4, 2024

(30) Foreign Application Priority Data
Nov. 13, 2020 (JP) .................................. 2020-189220

(51) Int. Cl.
*H02M 1/00* (2007.01)
*B60R 16/03* (2006.01)
(Continued)

(52) U.S. Cl.
CPC ........... *H02M 1/0009* (2021.05); *B60R 16/03* (2013.01); *H02M 7/537* (2013.01); *H03K 17/0826* (2013.01); *H03K 2217/0027* (2013.01)

(58) Field of Classification Search
CPC ............ H02M 1/0003; H02M 1/0009; H02M 1/0012; H02M 1/0025; H02M 1/08;
(Continued)

(56) References Cited

U.S. PATENT DOCUMENTS

| 2006/0215341 A1 | 9/2006 | Sakurai et al. |
| 2012/0098573 A1 | 4/2012 | Sasaki |

(Continued)

FOREIGN PATENT DOCUMENTS

| JP | 2006-271098 A | 10/2006 |
| JP | 2011-125101 A | 6/2011 |

(Continued)

OTHER PUBLICATIONS

English Translation of International Search Report of International Application No. PCT/JP2021/033349 dated Nov. 30, 2021 (2 pages).

*Primary Examiner* — Thienvu V Tran
*Assistant Examiner* — Carlos O Rivera-Perez
(74) *Attorney, Agent, or Firm* — Foley & Lardner LLP (57) ABSTRACT

Provided is a power conversion device on which an IGBT power module that includes a main IGBT and a current sense IGBT in the same semiconductor chip is mounted, wherein the power conversion device is a high-performance and highly reliable power conversion device capable of accurately estimating a main current flowing through the main IGBT using a sense current in an entire operation region of the power conversion device. A power conversion device includes: a first IGBT through which a main current flows; a second IGBT which is disposed on the same semiconductor substrate as the first IGBT and through which a sense current flows; and a measurement device which calculates the main current based on the sense current, wherein the (Continued)

measurement device selects a method of calculating the main current corresponding to a current value of the sense current.

13 Claims, 8 Drawing Sheets

(51) Int. Cl.
*H02M 7/537* (2006.01)
*H03K 17/082* (2006.01)

(58) Field of Classification Search
CPC ........ H02M 1/088; H02M 1/32; H02M 1/327; H02M 7/42; H02M 7/44; H02M 7/48; H02M 7/515; H02M 7/521; H02M 7/53; H02M 7/537; H02M 7/5831; H02M 7/53862; H02M 7/5387; H02M 7/53871; H02M 7/53873; B60R 16/00; B60R 16/02; B60R 16/03; H03K 17/08; H03K 17/082; H03K 17/0822; H03K 17/0826; H03K 17/0828; H03K 17/0812; H03K 17/08122; H03K 17/08126; H03K 17/08128; H03K 17/0814; H03K 17/08142; H03K 17/08146; H03K 17/08148; H03K 2217/0027; H03K 2017/0806; H10D 12/00; H10D 12/411; H10D 12/441; H10D 12/491
USPC .... 363/13, 15–21.3, 34, 40–43, 95–99, 123, 363/131–134; 323/266, 271–278, 280, 323/282–285, 351, 907
See application file for complete search history.

(56) References Cited

U.S. PATENT DOCUMENTS

2020/0211745 A1 7/2020 Ikegaya et al.
2020/0403516 A1* 12/2020 Kawamura ............. H02M 1/38

FOREIGN PATENT DOCUMENTS

| JP | 2011-149926 A | 8/2011 |
| JP | 2012-090499 A | 5/2012 |
| WO | WO-2019/012777 A1 | 1/2019 |

\* cited by examiner

POWER CONVERSION DEVICE AND METHOD OF CONTROLLING POWER CONVERSION DEVICE

TECHNICAL FIELD

The present invention relates to a configuration of a power conversion device and a control of the power conversion device, and more particularly to a technique that is effectively applicable to a power conversion device that includes an IGBT power module incorporating a current sense element therein.

BACKGROUND ART

In an in-vehicle inverter, a motor is controlled by driving a current of a power module that uses a high withstand voltage semiconductor element such as an Si-insulated gate bipolar transistor (Si-IGBT) or an SiC metal-oxide-semiconductor field-effect transistor (SiC-MOSFET). In order to control a traveling speed of an automobile in a stable manner, it is necessary to accurately detect an output current value of an inverter that drives a motor.

In an inverter current control, an output current value is detected by a current sensor, and a feedback control is applied to the detected output current value. As a means for detecting a current of an inverter, there has been known a method where a Hall sensor or the like is mounted on a bus bar, and a current is measured by measuring a magnetic field generated by an output current.

As another method, there has been known a method where an Si-IGBT which is a switching element for controlling a current of an inverter and a sense IGBT element disposed in the same semiconductor chip as the Si-IGBT and having a common gate terminal and a common collector terminal with the Si-IGBT are provided, and an output current of the inverter is detected by measuring an emitter current of the sense IGBT element. This method eliminates the need for components such as a Hall sensor and hence, the method is effective in reducing a size of the inverter and a manufacturing cost of the inverter.

As a background art in this technical field, for example, there has been known a technique disclosed in PTL 1, for example. PTL 1 discloses, as a method of detecting a current of an IGBT, a method where a main IGBT through which a main current flows, a sense IGBT that has a common collector terminal and a common gate terminal with the main IGBT, and a temperature measurement means are mounted on the same semiconductor substrate, and a main current is estimated based on an emitter current value of the sense IGBT and a temperature measurement value obtained by the temperature measurement unit.

CITATION LIST

Patent Literatures

PTL 1: JP 2006-271098 A

SUMMARY OF INVENTION

Technical Problem

In PTL 1 described above, the main current is estimated based on a sense current assuming that an emitter current of the main IGBT through which the main current flows and an emitter current of the sense IGBT through which a sense current flows are proportional to each other.

However, while the main current is several 100 A, the sense current is approximately several mA. A ratio between the main current and the sense current is related to an area of the main IGBT and an area of the sense IGBT. In the IGBT, a plurality of gate terminals and a plurality of emitter terminals are disposed in an array on a front surface of an Si substrate, and a current flows in the vertical direction from a collector mounted on a back surface of the Si substrate to the emitters mounted on the front surface of the Si substrate. In such an operation, a current that flows to the emitters disposed in the periphery of the array spreads to the periphery of the chip. In the sense IGBT that is smaller than the main IGBT in size, with respect to a current component, a ratio of the current component at a peripheral portion of the element is large. Accordingly, a ratio between an emitter current of the main IGBT and an emitter current of the sense IGBT changes between a low current region where a peripheral current component is relatively large and a region where an inside current component is relatively large.

Further, in a state where the IGBT is mounted on a power module, it is necessary to take into consideration the influence of a voltage drop caused by a wiring resistance in addition to the characteristics of the element. The wiring of the emitter terminals of the main IGBT and the wiring of the emitter terminals of the sense IGBT differ from each other. As a result, a sense ratio between a main current and a sense current changes also in a high current region where the influence of the wiring resistance is large.

Accordingly, the ratio between the main current and the sense current is not a fixed value and changes depending on magnitude of a main current. When a main current is calculated based on a sense current on the assumption that a ratio between the main current and the sense current is a fixed value, an error between a calculated current value and an actual current value is large. Accordingly, an inverter current control becomes inaccurate thus giving rise to a drawback that an acceleration control of a vehicle is not stable.

Accordingly, it is an object of the present invention to provide a power conversion device on which an IGBT power module that includes a main IGBT and a current sense IGBT in the same semiconductor chip is mounted, wherein the power conversion device is a high-performance and highly reliable power conversion device capable of accurately estimating a main current flowing through the main IGBT using a sense current in an entire operation region of the power conversion device. It is also an object of the present invention to provide a method of controlling such a power conversion device.

Solution to Problem

To overcome the above-mentioned drawback, the present invention provides a power conversion device that includes: a first IGBT through which a main current flows; a second IGBT which is disposed on the same semiconductor substrate as the first IGBT and through which a sense current flows; and a measurement device which calculates the main current based on the sense current, wherein the measurement device selects a method of calculating the main current corresponding to a current value of the sense current.

The present invention also provides a method of controlling a power conversion device on which an IGBT power module including a main IGBT and a current sense IGBT in the same semiconductor chip is mounted, wherein the method includes the steps of: selecting a method of calculating a main current flowing through the main IGBT corresponding to a current value of a sense current flowing through the current sense IGBT; and calculating the main current based on the sense current by the selected calculation method.

Advantageous Effects of Invention

According to the present invention, it is possible to realize a power conversion device on which an IGBT power module that includes a main IGBT and a current sense IGBT in the same semiconductor chip is mounted, wherein the power conversion device is a high-performance and highly reliable power conversion device capable of accurately estimating a main current flowing through the main IGBT using a sense current in an entire operation region of the power conversion device. It is also possible to realize a method of controlling such a power conversion device.

As a result, a feedback control of an output current of the power conversion device can be performed in a stable manner regardless of the magnitude of the output current and hence, a motor operates accurately, and the acceleration controllability of an automobile is made stable.

Problems, configurations, and advantageous effects other than those described above will be clarified by the following description of embodiments.

DESCRIPTION OF EMBODIMENTS

Hereinafter, embodiments of the present invention will be described with reference to the drawings. In the respective drawings, the same components are denoted by the same reference numerals, and the detailed description of overlapping components is omitted.

First Embodiment

Figure 1:
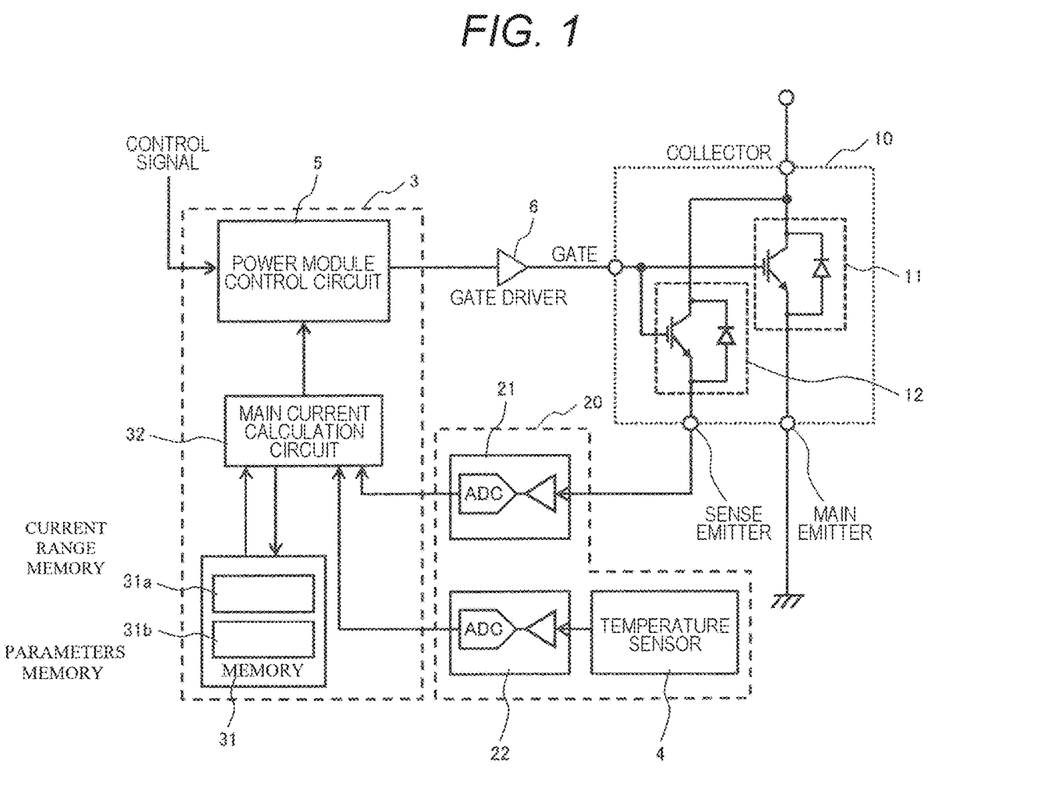
FIG. 1 is a block diagram illustrating a schematic configuration of a power conversion device according to a first embodiment of the present invention.
Figure 2:
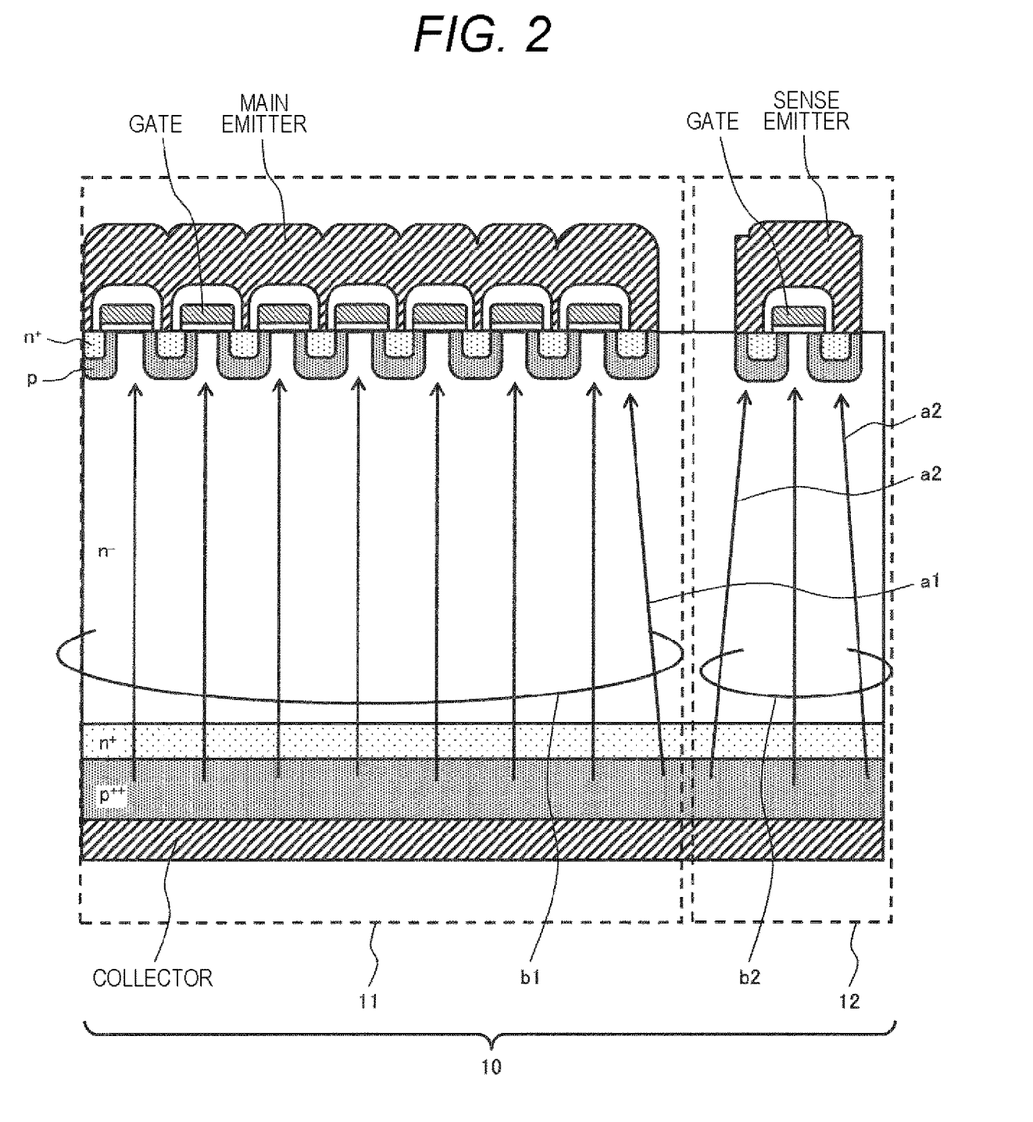
FIG. 2 is a partial cross-sectional view of an IGBT with a built-in current sense element according to the first embodiment of the present invention.
Figure 3:
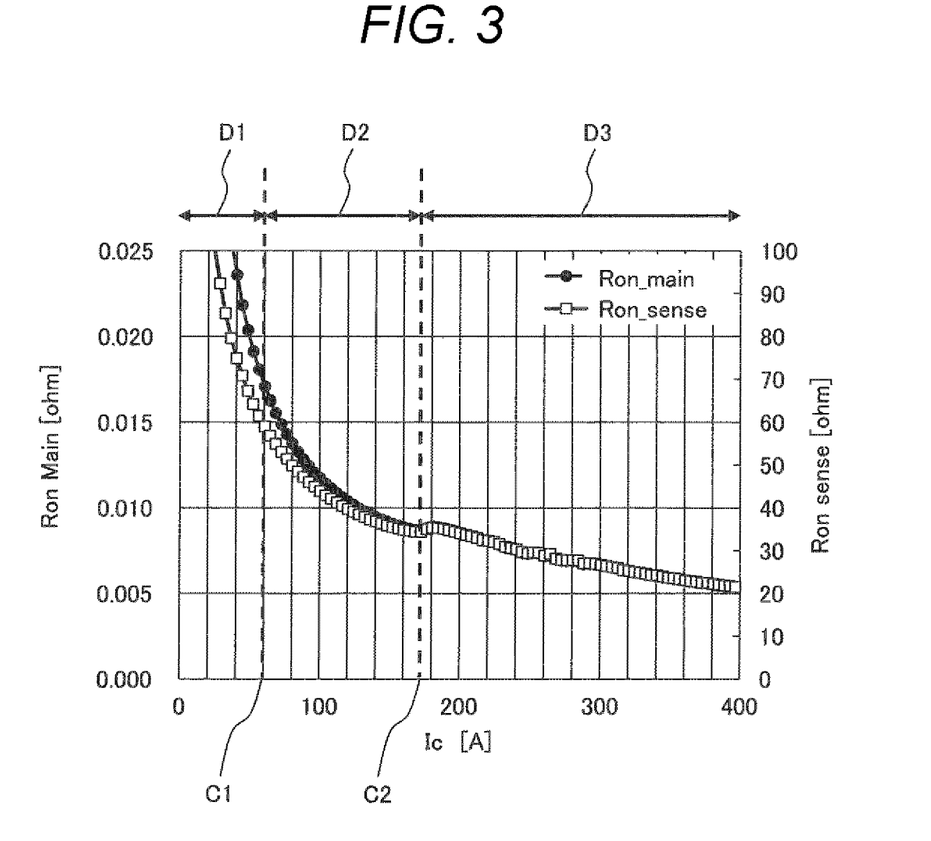
FIG. 3 is a graph illustrating a relationship between an on-resistance and a collector current with respect to a main IGBT and a sense IGBT according to the first embodiment of the present invention.

A power conversion device and a method of controlling the power conversion device according to a first embodiment of the present invention will be described with reference to FIG. 1 to FIG. 3. FIG. 1 is a block diagram illustrating a schematic configuration of the power conversion device according to the present embodiment. FIG. 2 is a partial cross-sectional view of a current sense element built-in IGBT which is mounted on the power conversion device illustrated in FIG. 1. FIG. 3 is a graph illustrating a relationship between an on-resistance and a collector current with respect to a main IGBT and a sense IGBT of the current sense element built-in IGBT illustrated in FIG. 2.

First, the configuration and the manner of operation of the power conversion device of the present embodiment will be described with reference to FIG. 1. FIG. 1 illustrates an example where the present invention is applied to a ground side of the power conversion device.

As illustrated in FIG. 1, the power conversion device of the present embodiment includes, as main components thereof, a microcomputer 3, a gate driver 6, a sense IGBT chip 10, and a sense unit 20.

The sense IGBT chip 10 that outputs a current includes: a main IGBT 11 that through which a main current flows; and a sense IGBT 12 that has an element area on a semiconductor substrate which is one several thousandth to one several ten thousandth of an element area of the main IGBT 11. A collector terminal and a gate terminal of the sense IGBT 12 are connected to a collector terminal and a gate terminal of the main IGBT 11, correspondingly.

The sense unit 20 includes a temperature sensor 4, a current detector 21, and a current detector 22.

The current detector 21 is a current sense circuit for an emitter current outputted from the sense IGBT 12. A sense current which flows from the emitter terminal of the sense IGBT 12 is measured by the current detector 21 of the sense unit 20, and is converted into a digital value by an AD converter. The output value of the current detector 21 is inputted to the microcomputer 3 for main current calculation.

The current detector 22 is a current sense circuit of the temperature sensor 4. The temperature sensor 4 that measures a temperature of the sensed IGBT chip 10 is formed of a diode, a resistor, and the like, outputs a temperature of the IGBT as a current value, and the current value is inputted to the microcomputer 3 via the current detector 22.

In the present embodiment, FIG. 2 illustrates a cross-sectional structure of a part of the main IGBT 11 and the sense IGBT 12 in the sensed IGBT chip 10. The arrows in FIG. 2 schematically illustrate the flows of currents.

In the main IGBT 11, many elements are arranged in a matrix. In the sense IGBT 12, the elements smaller in number than the elements in the main IGBT 11 are arranged.

Assume that a current ratio R1 of a peripheral current component a1 to a current b1 which flows to a collector terminal of the main IGBT 11 is R1=a1/b1, and that a current ratio R2 of a current a2 which flows from a periphery to a current b2 which flows from a collector terminal of the sense IGBT 12 is R2=a2/b2. In this case, the current ratio R2 is larger than the current ratio R1. Accordingly, in a current operation range of a collector current where the influence of the peripheral current component is large, as illustrated by D1 in FIG. 3, the on-resistance (Ron sense) of the sense IGBT 12 is relatively lower than the on-resistance (Ron main) of the main IGBT 11.

Accordingly, as described in PTL 1, in a case where a relationship is made between a main current and a sense current by one linear expression in all operation ranges consisting of the current range (D1) where the influence of the peripheral current component is large and the current ranges (D2 and D3) where the influence of the peripheral current component is small with respect to the relationship between the collector current and the on-resistance in FIG. 3, an error between a main current value calculated based on a sense current and an actual main current value becomes large. As a result, in a motor control performed by an inverter, an error of the main current value obtained based on the sense current becomes large and hence, a motor cannot be accurately controlled.

On the other hand, in the present embodiment, in a case where a main current value is calculated based on a sense current value, with respect to the relationship between a collector current and an on-resistance illustrated in FIG. 3, a current range is divided into the current range (D1) where the influence of the peripheral current component is large and the current ranges (D2 and D3) where the influence of the peripheral current component is small, and a calculation method of the main current is optimized in the respective ranges, whereby the accuracy of a main current value obtained by calculation in the entire operation range is improved.

As has been described above, the power conversion device of the present embodiment includes: the main IGBT 11 (first IGBT) through which a main current flows; the sense IGBT 12 (second IGBT) which is disposed on the same semiconductor substrate as the main IGBT 11 (first IGBT) and through which a sense current flows; and the measurement device (the microcomputer 3 and the sense unit 20) which calculates the main current based on the sense current, wherein the measurement device (the microcomputer 3 and the sense unit 20) selects a method of calculating the main current corresponding to a current value of the sense current.

Further, the measurement device (the microcomputer 3 and the sense unit 20) calculates a first on-resistance of the main IGBT 11 (the first IGBT) or a second on-resistance of the sense IGBT 12 (the second IGBT) based on measurement data of a main current and measurement data of a sense current, and determines a current range of a sense current based on the sense current dependency of the first on-resistance or the second on-resistance.

Further, the measurement device (the microcomputer 3 and the sense unit 20) determines the current range of the sense current based on measurement data of the main current and the measurement data of the sense current in accordance with the sense current dependency of the main current.

By applying the present technique to a motor control which uses an in-vehicle inverter, a motor operation can be controlled in a stable manner.

Furthermore, in the respective divided current ranges formed of the current range D1, the current range D2 and the current range D3, the relationship between a main current and a sense current can be accurately approximated using a simple polynomial such as a quadratic function. Accordingly, an increase in the number of parameters required for calculation of the main current can be suppressed.

Second Embodiment

An IGBT power module according to a second embodiment of the present invention will be described with reference to FIG. 5. In the present embodiment, a case is described where a relationship expression between a main IGBT and a sense IGBT is optimized by dividing a current range of an output current of a power conversion device into a current range where the influence of a wiring resistance is small and a current range where the influence of the wiring resistance is large.

Figure 5:
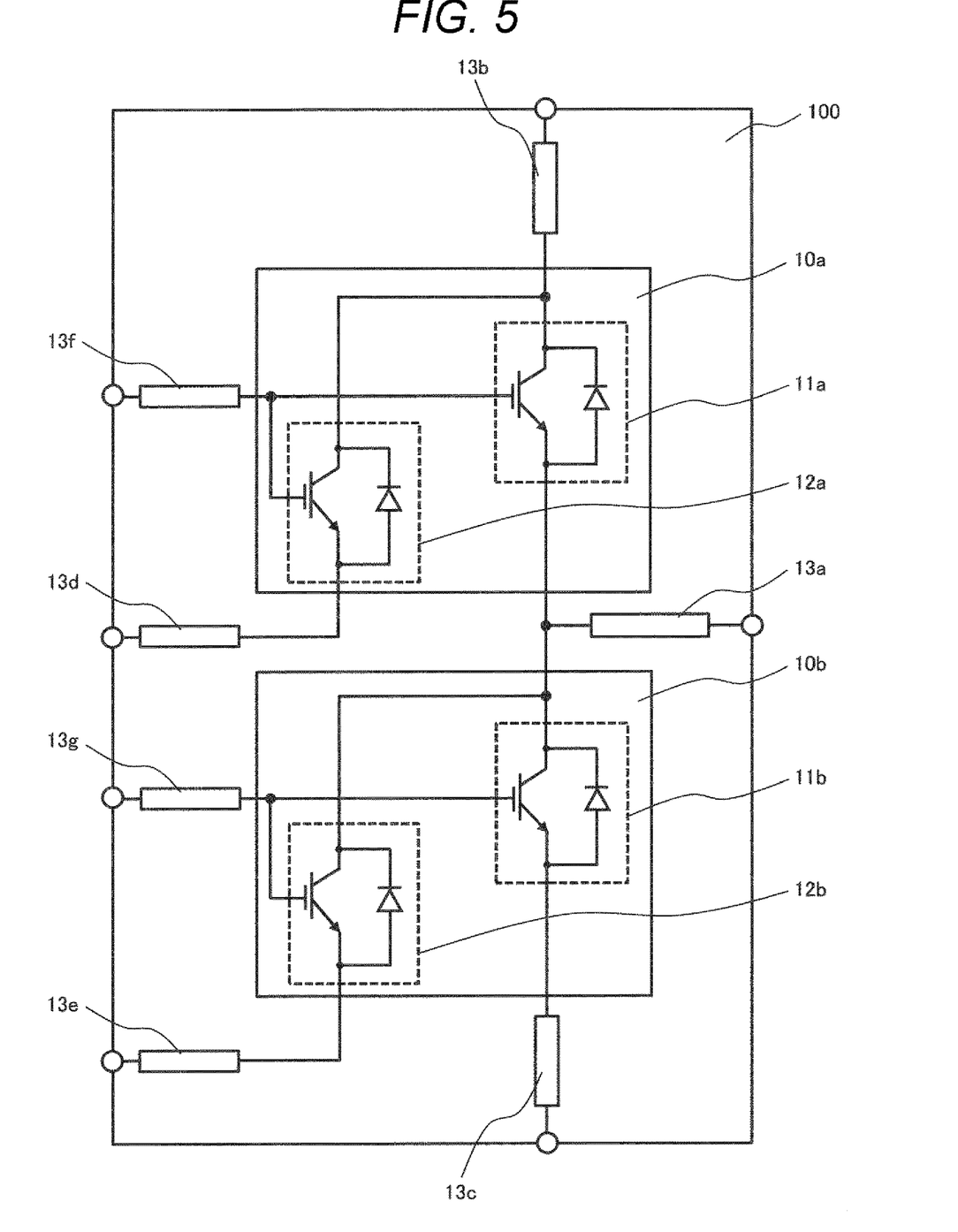
FIG. 5 is a block diagram illustrating a schematic configuration of an IGBT power module according to a second embodiment of the present invention.

FIG. 5 is a block diagram illustrating a schematic configuration of an IGBT power module which is mounted on the power conversion device described in the first embodiment (FIG. 1). Although only a low potential side of the power conversion device is illustrated in FIG. 1, FIG. 5 illustrates a block diagram (wiring diagram) of an IGBT power module 100 which is formed of the IGBT on a high potential side and the IGBT on a low potential side.

A sensed IGBT chip 10a is a current switch on a high potential side. A main IGBT 11a through which a main current flows and a sense IBGBT 12a are mounted on the sensed IGBT chip 10a. In the same manner, a sensed IGBT chip 10b is a current switch on a low potential side. A main IGBT 11b through which a main current flows and a sense IBGBT 12b are mounted on the sensed IGBT chip 10b.

The sensed IGBT chips 10a and 10b are connected to each other by metal wiring in the IGBT power module 100. The respective metal wiring resistances are denoted by 13a to 13g.

In particular, in a case where a high current flows between a collector and an emitter of the IGBT, it is necessary to take into consideration the wiring resistance. The wiring resistances 13a and 13c connected to the respective emitter terminals of the main IGBTs 11a and 11b differ from the wiring resistances 13d and 13e connected to the respective emitter terminals of the sense IGBTs 12a and 12b. Accordingly, in a current range where the influence of the wiring resistance is large and in a current range where the influence of the wiring resistance is small, voltage-current characteristics as viewed from terminals of the IGBT power module 100 differ between the main IGBTs 11a and 11b and the sense IGBTs 12a and 12b.

Accordingly, in the same manner as the first embodiment, in the relationship between a collector current and an on-resistance illustrated in FIG. 3, a current range of an output current is divided into a current range (D3) where the influence of the wiring resistance is large and the current ranges (D1 and D2) where the influence of the current resistance is small, and a method of calculating a main current is optimized in the respective ranges, whereby the accuracy of a main current value obtained by calculation in the entire operation range is improved.

By applying the present technique to a motor control which uses an in-vehicle inverter, a motor operation can be controlled in a stable manner.

Third Embodiment

In the present embodiment, a case is described where both a peripheral current component of an IGBT and a wiring resistance component of a power module cannot be ignored.

When both the peripheral current component of the IGBT and the wiring resistance component of the power module cannot be ignored, the current range illustrated in FIG. 3 is divided into three ranges D1, D2, and D3, and a relationship expression between a main current and a sense current is optimized in respective ranges, whereby the accuracy of a main current value is improved in the entire operation range.

By applying the present technique to a motor control which uses an in-vehicle inverter, a motor operation can be controlled in a stable manner.

Fourth Embodiment

Figure 4:
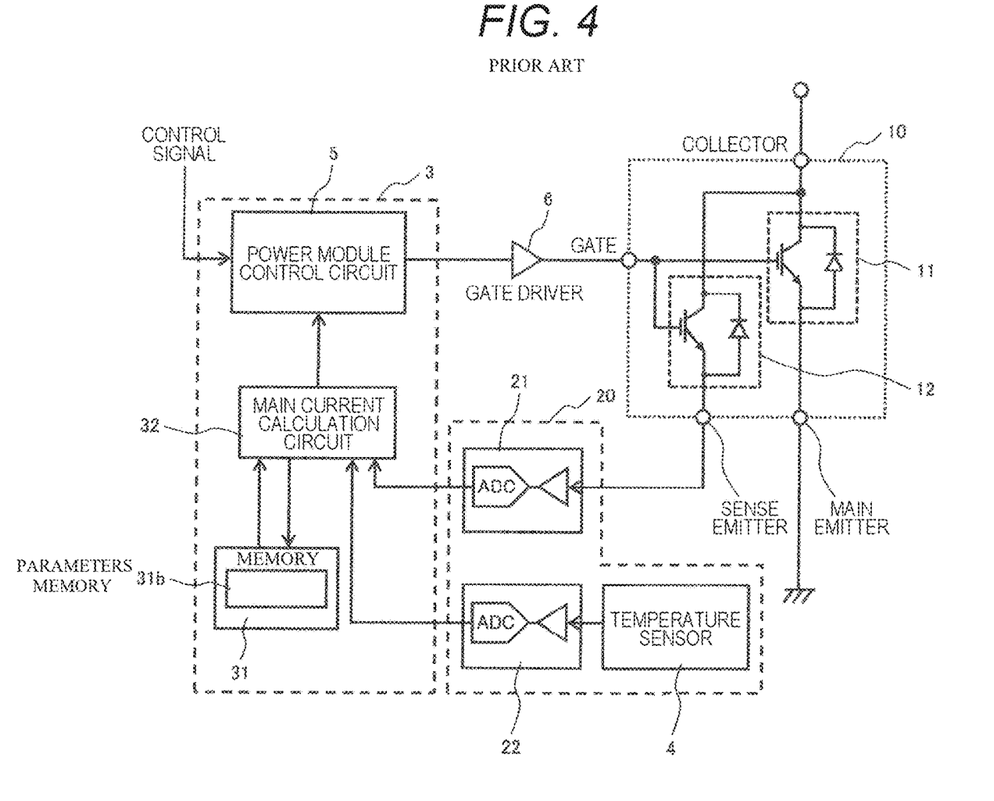
FIG. 4 is a block diagram illustrating a schematic configuration of a conventional power conversion device.
Figure 9:
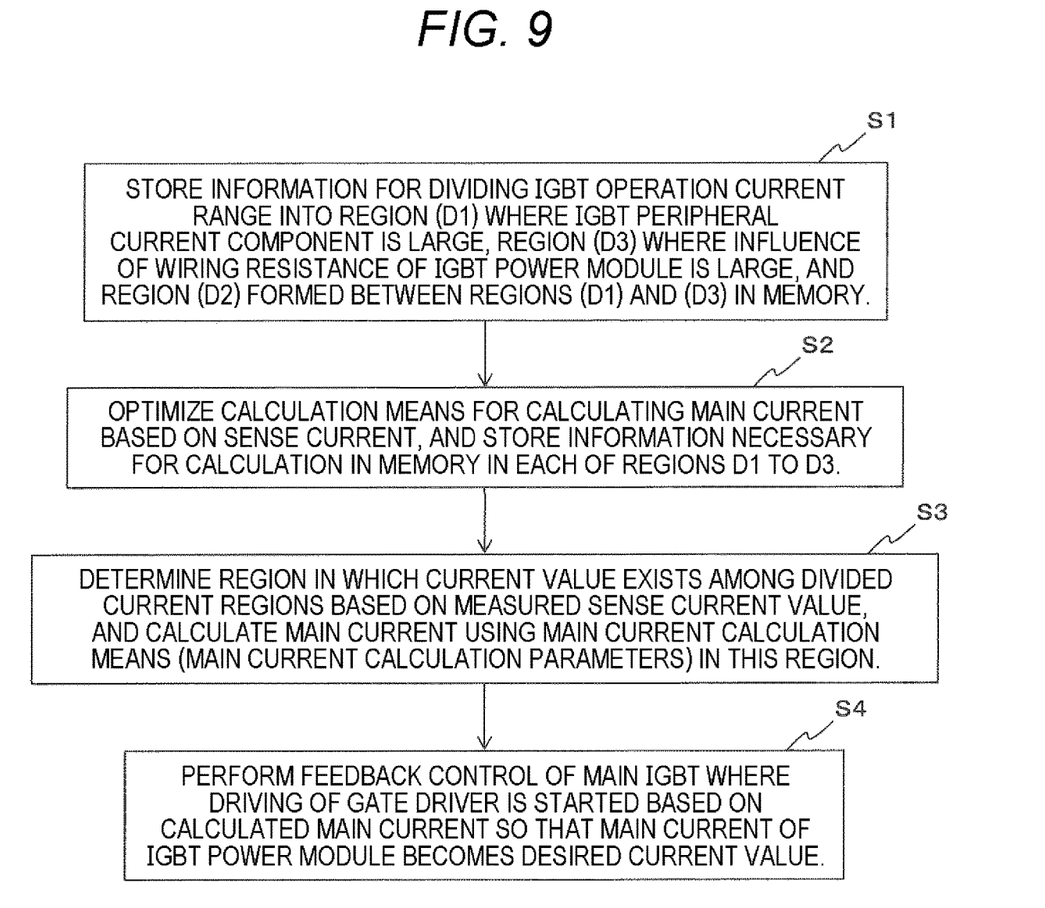
FIG. 9 is a flowchart illustrating a method of controlling a representative power conversion device of the present invention.

A power conversion device and a method of controlling the power conversion device according to a fourth embodiment of the present invention will be described with reference to FIG. 1 to FIG. 4 and FIG. 9. FIG. 4 is a block diagram of a conventional power conversion device illustrated as a comparative example in order to facilitate the understanding of the configuration of the power conversion device according to the present invention. FIG. 9 is a flowchart illustrating a representative method of controlling the power conversion device of the present invention.

In the power conversion device illustrated in FIG. 1, the microcomputer 3 includes: a storage device (memory) 31; a main current calculation circuit 32 that calculates a main current based on a temperature and a sense current; and a power module control circuit 5 that controls the main current. The storage device (memory) 31 includes: a storage device (memory) 31a which stores information of a current range; and a storage device (memory) 31b which stores information necessary for calculating a main current based on a sense current in each current range.

In a test step performed before shipment of the power conversion device, a collector current and an on-resistance of a main IGBT 11 and a collector current and an on-resistance of a sense IGBT 12 are measured, and data corresponding to graphs illustrated in FIG. 3 is acquired. The current-voltage characteristic of the IGBT has dependency on a temperature and hence, the characteristics corresponding to graphs illustrated in FIG. 3 are measured at a plurality of temperatures.

At each temperature, sense current values C1s, C2s corresponding to a collector current C1 at a boundary between the current ranges D1 and D2 in FIG. 3 and a collector current C2 at a boundary between the current ranges D2 and D3 in FIG. 3 respectively are stored in the storage device 31a.

Next, in each of the current range D1, the current range D2, and the current range D3, the relationship between a main current and a sense current at each temperature is obtained by a least squares method or the like, and parameters necessary for the calculation of the main current are stored in the storage device 31b.

In an actual operation of the power conversion device, the main current calculation circuit 32 calculates a main current in such a manner that, using an output value of the current detector 21 and an output value which is obtained by processing temperature information of the IGBT detected by the temperature sensor 4 by the detector 22 as input values, compares a value of the current detector 21 with the C1s of the storage device 31a, determines which range the current value exists among D1, D2, and D3, reads parameters of a calculation expression corresponding to the determined range from the storage device 31b, and calculates the main current.

On the other hand, in the power conversion device described in PTL 1 illustrated in FIG. 4, as compared with the configuration of FIG. 1, the storage device (memory) 31 is only a memory 31b that stores information of the relationship expression between a main current and a sense current, and there is no information relating to dividing a current range into a plurality of current ranges. For this reason, an error becomes large in any one of ranges from a low current to a high current.

In the above-mentioned operation, sense current values C1s and C2s and parameters indicating the relationship between a main current and a sense current in respective current ranges are obtained based on measurement values in the test step of the power conversion device. However, it may be possible that these data are acquired in the test step of the IGBT power module, and are stored in the storage device 31a of the microcomputer 3 after the power conversion device is assembled.

FIG. 9 is a flowchart illustrating a main flow in a method of controlling the power conversion device of the present embodiment.

First, information for dividing an IGBT operation current range into a region (D1) where an IGBT peripheral current component is large, a region (D3) where the influence of a wiring resistance of the IGBT power module is large, and a region (D2) formed between the regions (D1) and (D3) is stored in the memory. (Step S1)

Next, in each of the regions D1 to D3, a calculation means for calculating a main current based on a sense current is optimized, and information necessary for the calculation is stored in the memory. (Step S2)

Subsequently, at the time of performing an actual operation of the power conversion device, the region in which a current value exists among the divided current regions is determined based on a measured sense current value, and a main current is calculated using the main current calculation means (main current calculation parameters) in the region. (Step S3)

As a last step, a feedback control of the main IGBT is performed where driving of a gate driver is started based on the calculated main current so that the main current of the IGBT power module becomes a desired current value. (Step S4)

As has been described heretofore, in the power conversion device according to the present embodiment, the measurement device (the microcomputer 3 and the sense unit 20) includes: the sense unit 20 which measures a sense current and a temperature of the semiconductor substrate; the main current calculation circuit 32 that calculates a main current based on the sense current measured by the sense unit 20 and the temperature information of the semiconductor substrate, the memory 31a (first storage device) that stores a plurality of current range information of the sense current; and the memory 31b (second storage device) that stores a plurality of calculation methods for calculating the main current based on the sense current. Based on a current value of the sense current measured by the sense unit 20, a current range corresponding to the current value is selected based on the plurality of current range information of the memory 31a (first storage device), and a calculation method of the main current corresponding to the selected current range is selected from the plurality of calculation methods stored in the memory 31b (second storage device).

Further, the measurement device (the microcomputer 3 and the sense unit 20) determines which current range in the plurality of current range information a current value of the sense current corresponds, reads a method of calculating a main current corresponding to the determined current range from the storage device 31, and calculates the main current.

As the method of calculating a main current, for example, a calculation method where the main current is expressed by a quadratic approximate expression of a sense current is used.

Fifth Embodiment

In the present embodiment, a method of obtaining the relationship between a main current and a sense current in respective current ranges in the first to fourth embodiments will be described.

The relationship between a main current and a sense current in the respective current ranges D1, D2, and D3 or in a current range formed by combining the plurality of current ranges is calculated by expressing the main current as a quadratic expression of the sense current by a least squares method or the like based on data measured at a plurality of temperatures in a test step of the power conversion device or in a test step of the IGBT power module.

However, the calculation for obtaining the relationship between the sense current and the main current is not limited to the least squares method, and other methods may be used. Further, a main current may be expressed by one expression as both a function of a sense current and a function of a temperature.

Sixth Embodiment

Figure 6:
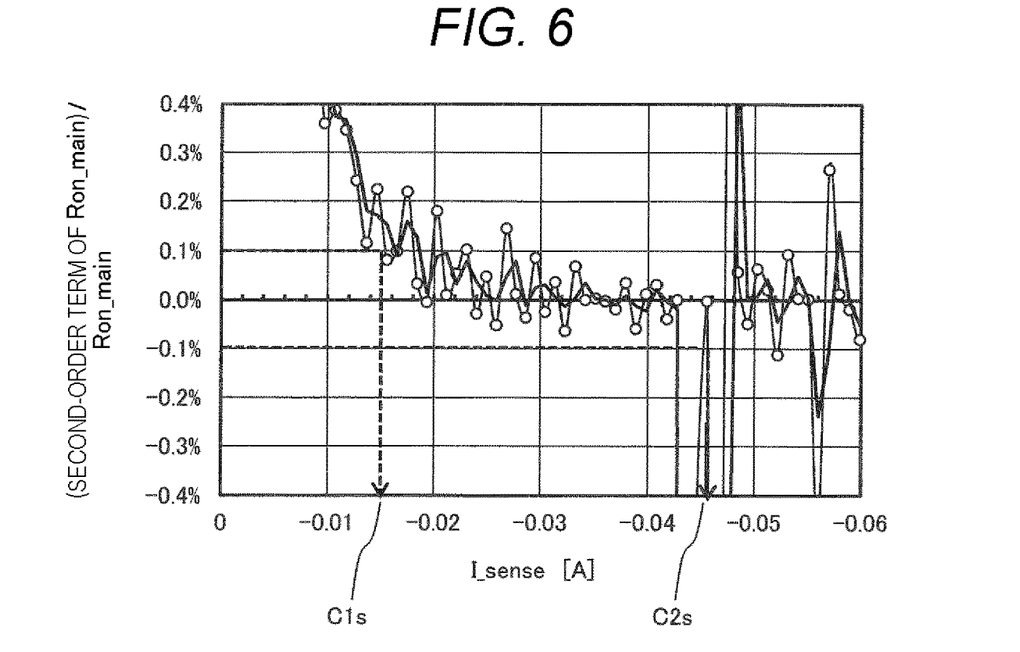
FIG. 6 is a graph illustrating a relationship between a second-order term of an on-resistance of a sense IGBT and a sense current with respect to an on-resistance of a main IGBT according to a sixth embodiment of the present invention.

An example of a method of determining sense current values C1s and C2s will be described with reference to FIG. 6. In a case where a main current is calculated by a sense current which is expressed by a quadratic expression, it is necessary to divide a current range at a boundary where a second-order term greatly changes in front of and behind the boundary. FIG. 6 illustrates a relationship between a second-order coefficient [expression (1)] and a sense current when an on-resistance of the main IGBT 11 is a function of an on-resistance of the sense IGBT 12. A bold line indicates a moving average. For example, assume a sense current value when the value of the expression (1) exceeds 0.1% as C1s and a sense current value when the value of the expression (1) exceeds −0.1% as C2s.

[Expression 1]

$$\text{Second-order term of } Ron\_main \text{ vs. } Ron\_sense \approx \qquad (1)$$

$$\frac{d^2 Ron\_main}{dRon\_sense^2} \cdot \Delta Ron\_sense^2 / Ron\_main$$

In the expression (1), Ron main is an on-resistance of the main IGBT, and Ron sense is an on-resistance of the sense IGBT.

Seventh Embodiment

Figure 7:
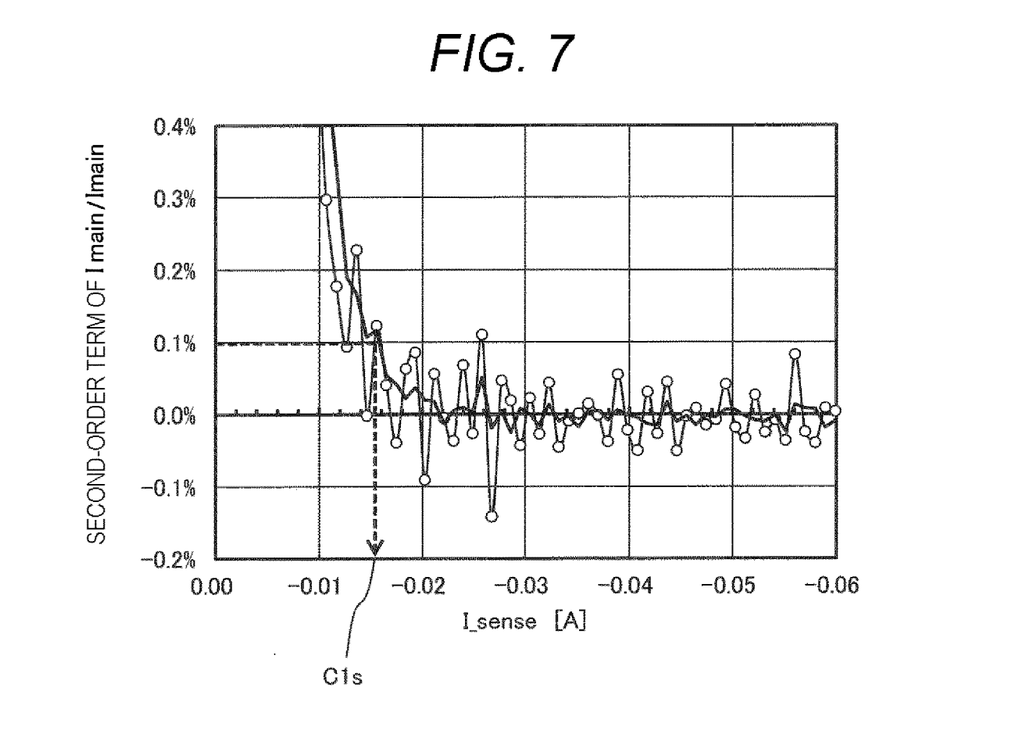
FIG. 7 is a graph illustrating a relationship between a second-order term of an emitter current of a sense IGBT and a sense current with respect to an emitter current of a main IGBT according to a seventh embodiment of the present invention.

With reference to FIG. 7, an example is described where a sense current value C1s is determined based on the relationship between a secondary coefficient [expression (2)] and a sense current assuming the main current as a function of the sense current.

In a case where a main current is calculated by a sense current which is expressed by a quadratic expression, it is necessary to divide a current range at a boundary where a second-order term greatly changes in front of and behind the boundary. The relationship between the value of the expression (2) and the sense current value is illustrated in FIG. 7. For example, assume that the sense current value when the value of the expression (2) exceeds 0.1% as C1s.

[Expression 2]

$$\text{Second-order term of } I\_main \text{ vs. } I\_sense \approx \qquad (2)$$

$$\frac{d^2 I\_main}{dI\_sense^2} \cdot \Delta I\_sense^2 / I\_main$$

In the expression (2), I_main is a main current value, and I_sense is a sense current value.

Eighth Embodiment

Figure 8:
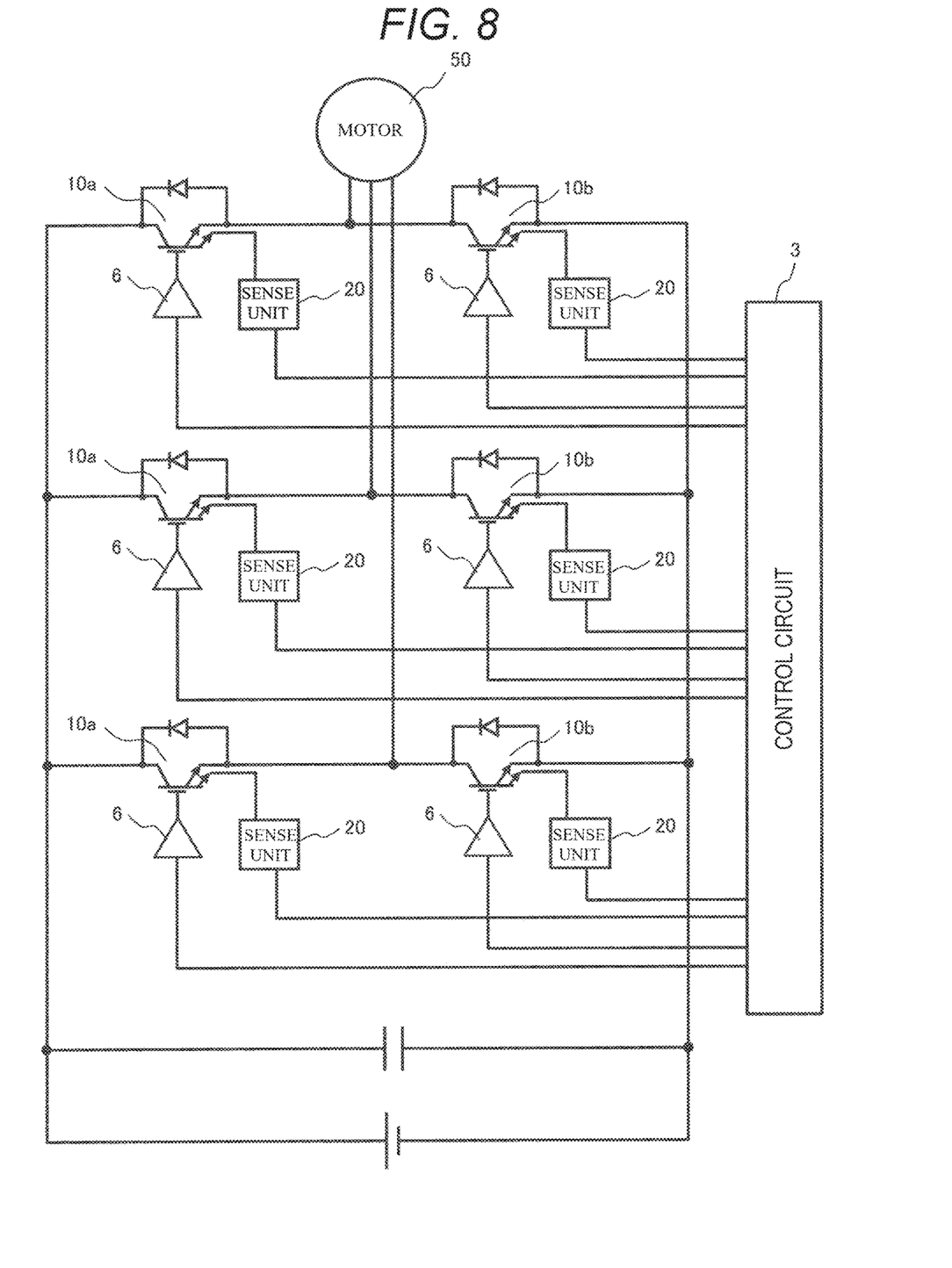
FIG. 8 is a block diagram illustrating a schematic configuration of in-vehicle inverter control system according to an eighth embodiment of the present invention.

With reference to FIG. 8, an in-vehicle inverter control system according to an eighth embodiment of the present invention will be described. FIG. 8 is a block diagram illustrating a schematic configuration of an in-vehicle inverter control system according to the present embodiment. FIG. 8 illustrates an example where the present invention is applied to a three-phase inverter.

In FIG. 8, a motor 50 is driven by an IGBT power module which includes three sets of sensed IGBT chips 10a and 10b. With respect to main currents which flow from the respective main IGBTs to the motor 50, driving of the gate drivers 6 is started such that the main currents become desired current values in the control circuit (microcomputer) 3 using the method described in any one of the first to seventh embodiments based on current values of the sense IGBTs and measured temperature values of the respective sense units 20 thus performing a feedback control of the respective IGBTs 10a and 10b.

The present invention is not limited to the above-described embodiments, and includes various modifications of these embodiments. For example, the above-described embodiments have been described in detail for facilitating the understanding of the present invention. However, the present invention is not necessarily limited to the power conversion device which includes all constituent elements described above. Further, a part of the configuration of one embodiment can be replaced with the configuration of another embodiment, and the configuration of another embodiment can be added to the configuration of one embodiment. Further, with respect to parts of the configurations of the respective embodiments, the addition, the deletion and the replacement of other configurations can be made.

REFERENCE SIGNS LIST 3 microcomputer (control circuit)
4 temperature sensor
5 power module control circuit
6 gate driver
10a, 10b sensed IGBT chip
11, 11a, 11b main IGBT
12, 12a, 12b sense IGBT
13a to 13g wiring resistance in IGBT power module 100
20 sense unit
21 current detector (current sense circuit of sense IGBT 12)
22 current detector (current sense circuit of temperature sensor 4)
31 storage device (memory)
31a storage device (memory) which stores information of current ranges 31b storage device (memory) which stores information necessary for calculating main current based on sense current in each current range
32 main current calculation circuit
50 motor
100 IGBT power module
a1 current component in peripheral region of main IGBT 11
a2 current component in peripheral region of sense IGBT 12
b1 total current component of main IGBT 11
b2 total current component of sense IGBT 12
D1 range of collector current where influence of current component in peripheral region is large within operation current range of IGBT
D2 range of collector current formed between D1 and D3
D3 range of collector current where influence of wiring resistance of IGBT power module is large within operation current range of IGBT
C1 collector current in boundary between D1 and D2
C1s sense current value when collector current is C1
C2 collector current in boundary between D2 and D3
C2s sense current value when collector current is C2

The invention claimed is:

1. A power conversion device comprising:
a first IGBT through which a main current flows;
a second IGBT which is disposed on a same semiconductor substrate as the first IGBT and through which a sense current flows; and
a measurement device which calculates the main current based on the sense current,
wherein the measurement device selects a method of calculating the main current corresponding to a current value of the sense current, wherein
the measurement device calculates the main current by a first calculation method in a case where the sense current is within a first range,
the measurement device calculates the main current by a second calculation method in a case where the sense current is within a second range on a higher current side than the first range, and
the first range is a current range in which an influence of a current component in a peripheral region of each of the first IGBT and the second IGBT is relatively large compared to an influence of a current component in a central region of each of the first IGBT and the second IGBT.

2. The power conversion device according to claim 1, wherein
the measurement device includes:
a sense unit that measures the sense current and a temperature of the semiconductor substrate;
a main current calculation unit which calculates the main current based on the sense current measured by the sense unit and temperature information of the semiconductor substrate;
a first storage device that stores a plurality of pieces of current range information of the sense current; and
a second storage device that stores a plurality of calculation methods for calculating the main current based on the sense current.

3. The power conversion device according to claim 1, wherein
the second range is a current range in which an influence of a wiring resistance component increases in current-voltage dependency.

4. The power conversion device according to claim 1, wherein
the measurement device calculates the main current by a third calculation method in a case where the sense current is within a third range between the first range and the second range,
the second range is a current range in which an influence of a wiring resistance component increases in current-voltage dependency.

5. The power conversion device according to claim 1, further comprising a storage device which stores a plurality of pieces of current range information of the sense current and a plurality of calculation methods for calculating the main current based on the sense current,
wherein
the measurement device determines which current range of the plurality of pieces of current range information the current value of the sense current corresponds to, and
the measurement device reads, from the storage device, a method of calculating the main current corresponding to the determined current range and calculates the main current.

6. The power conversion device according to claim 1, wherein the method of calculating the main current is a calculation method in which the main current is expressed by a quadratic approximate expression of the sense current.

7. The power conversion device according to claim 1, wherein
the measurement device calculates a first on-resistance of the first IGBT or a second on-resistance of the second IGBT based on measurement data of the main current and measurement data of the sense current, and
the measurement device determines a current range of the sense current based on sense current dependency of the first on-resistance or the second on-resistance.

8. The power conversion device according to claim 1, wherein the measurement device determines a current range of the sense current based on sense current dependency of the main current from measurement data of the main current and measurement data of the sense current.

9. The power conversion device according to claim 1, wherein the power conversion device is mounted on an in-vehicle inverter control system.

10. A method of controlling a power conversion device on which an IGBT power module which includes a main IGBT and a current sense IGBT are mounted on a same semiconductor chip, the method comprising the steps of:
selecting a method of calculating a main current flowing through the main IGBT corresponding to a current value of a sense current flowing through the current sense IGBT; and
calculating the main current based on the sense current by the selected calculation method, wherein
the main current is calculated by a first calculation method in a case where the sense current is within a first range,
the main current is calculated by a second calculation method in a case where the sense current is within a second range on a higher current side than the first range, and
the first range is a current range in which an influence of a current component in a peripheral region of each of the main IGBT and the current sense IGBT is relatively large compared to an influence of a current component in a central region of each of the main IGBT and the current sense IGBT.

11. The method of controlling a power conversion device according to claim 10, further comprising the steps of:
   measuring the sense current and a temperature of the semiconductor chip.

12. The method of controlling a power conversion device according to claim 10, wherein
   the second range is a current range in which an influence of a wiring resistance component increases in current-voltage dependency.

13. The method of controlling a power conversion device according to claim 10, wherein
   the main current is calculated by a third calculation method in a case where the sense current is within a third range between the first range and the second range,
   and
   the second range is a current range in which an influence of a wiring resistance component increases in current-voltage dependency.

* * * * *